(12) United States Patent  
Kokawa et al.

(10) Patent No.: US 8,338,859 B2  
(45) Date of Patent: Dec. 25, 2012

(54) SEMICONDUCTOR ELECTRONIC DEVICE HAVING REDUCED THREADING DISLOCATION AND METHOD OF MANUFACTURING THE SAME

(75) Inventors: Takuya Kokawa, Tokyo (JP); Sadahiro Kato, Tokyo (JP); Yoshihiro Sato, Tokyo (JP); Masayuki Iwami, Tokyo (JP)

(73) Assignee: Furukawa Electric Co., Ltd, Tokyo (JP)

( * ) Notice: Subject to any disclaimer, the term of this patent is extended or adjusted under 35 U.S.C. 154(b) by 451 days.

(21) Appl. No.: 12/569,429

(22) Filed: Sep. 29, 2009

(65) Prior Publication Data

US 2010/0078678 A1 Apr. 1, 2010

(30) Foreign Application Priority Data

Sep. 30, 2008 (JP) .................. 2008-254009

(51) Int. Cl.  
*H01L 21/02* (2006.01)  
*H01L 21/338* (2006.01)

(52) U.S. Cl. ............ 257/190; 257/615; 438/47; 438/94; 438/172

(58) Field of Classification Search ................ None  
See application file for complete search history.

(56) References Cited

U.S. PATENT DOCUMENTS

| | | | |
|---|---|---|---|
| 6,345,063 B1 * | 2/2002 | Bour et al. | 372/45.01 |
| 6,890,791 B2 * | 5/2005 | Ohtsuka et al. | 438/94 |
| 2005/0037526 A1 * | 2/2005 | Kamiyama et al. | 438/22 |
| 2007/0045639 A1 * | 3/2007 | Kato et al. | 257/94 |

FOREIGN PATENT DOCUMENTS

| | | |
|---|---|---|
| JP | 2002-043233 | 2/2002 |
| JP | 2003059948 | 2/2003 |
| JP | 2003-277196 | 10/2003 |
| JP | 2004-349387 | 12/2004 |
| JP | 2007088426 | 4/2007 |
| JP | 2008140649 | 6/2008 |
| JP | 2008-218479 | 9/2008 |

OTHER PUBLICATIONS

Japanese Office Action mailed Mar. 6, 2012 for Japanese Application No. 2008-254009, 5 pages (with translation).

* cited by examiner

*Primary Examiner* — Evan Pert  
*Assistant Examiner* — Andres Munoz  
(74) *Attorney, Agent, or Firm* — Turocy & Watson, LLP

(57) ABSTRACT

A semiconductor electronic device comprises a substrate; a buffer layer formed on said substrate, having two or more layers of composite layers in which a first semiconductor layer comprising nitride based compound semiconductor having smaller lattice constant and greater coefficient of thermal expansion than the substrate and a second semiconductor layer comprising nitride based compound semiconductor having smaller lattice constant and smaller coefficient of thermal expansion than the first semiconductor layer are alternately laminated; a semiconductor operating layer comprising nitride based compound semiconductor formed on said buffer layer; a dislocation reducing layer comprising nitride based compound semiconductor, formed in a location between a location directly under said buffer layer and inner area of said semiconductor operating layer, and comprising a lower layer area and an upper layer area each having an uneven boundary surface, wherein threading dislocation extending from the lower layer area to the upper layer area is bent at said boundary surface.

19 Claims, 12 Drawing Sheets

SEMICONDUCTOR ELECTRONIC DEVICE HAVING REDUCED THREADING DISLOCATION AND METHOD OF MANUFACTURING THE SAME

CROSS-REFERENCE TO RELATED APPLICATIONS

This application claims priority to Japanese patent application No. 2008-254009, filed on Sep. 30, 2008, the entire content of which is incorporated herein by reference.

BACKGROUND OF THE INVENTION

1. Field of the Invention

The present invention relates to a semiconductor electronic device using nitride based compound semiconductor and a method for manufacturing the same.

2. Description of Related Art

Electronic devices such as field effect transistors using nitride based compound semiconductors expressed by chemical formula $Al_xIn_yGa_{1-x-y}As_uP_vN_{1-u-v}$ (wherein, $0 \leq x \leq 1$, $0 \leq y \leq 1$, $0 \leq y \leq 1$, $0 \leq x+y \leq 1$, $0 \leq u \leq 1$, $0 \leq v \leq 1$, $u+v<1$), for instance GaN based compound semiconductors, have attracted attention as solid state devices that operate even under high temperature environments near 400° C. Unlike Si or GaAs, it is difficult for GaN based compound semiconductor to prepare single crystal substrates with large diameter. Therefore, electronic devices using GaN based compound semiconductor are prepared from substrates comprised of, for example, silicon carbide (SiC), sapphire, zinc oxide (ZnO) or silicon (Si). Large diameter substrates comprised of Si can be obtained at a low cost in particular and are very beneficial as substrates for electronic devices.

However, since there is a considerable difference in the lattice constant and coefficient of thermal expansion of Si and GaN, a great tensile strain is subtended on the GaN layer when the GaN layer is directly grown epitaxially on the Si substrate leading to development of concave warp and deterioration of the crystallinity over the entire epitaxial substrate on which the GaN layer is grown epitaxially. In addition, cracks are developed on the GaN layer if the underlying strain is large. Consequently, a buffer surface is usually arranged between the Si substrate and GaN layer as a strain-relieving layer. A laminated structure of GaN layers and AlN layers is effective as such buffer layer (refer to Patent Document 1 and 2).

The method of manufacturing GaN based field effect transistors described in Patent Document 1 involves epitaxial crystal growth such as MOCVD process on a 4 inch diameter (101.6 mm) substrate comprising Si single crystal, wherein AlN layer is first formed at a substrate temperature of around 1000-1100° C., and thereafter, a composite lamination is formed as a buffer layer by laminating GaN layers and AlN layers at about the same temperature. Thereafter, a semiconductor operating layer is formed by sequentially laminating an electron transit layer, an electron supply layer and a contact layer on a buffer layer and then separated into each device after forming source electrode, drain electrode and gate electrode. Thus, GaN layer can be grown epitaxially on a Si substrate without any cracks and with excellent crystallinity by making a buffer layer of a composite lamination of GaN layers and AlN layers. In addition, the warp over the entire epitaxial substrate is also improved. Moreover, the buffer layer is not just limited to a composite lamination of GaN layers and AlN layers, and a similar effect can be obtained if an appropriate amount of strain is present even if a composite lamination of AlGaN layers having a different chemical composition with respect to each other is used.

[Patent Document 1] Japanese Patent Application JP2003-59948 A1

[Patent Document 2] Japanese Patent Application JP2007-088426 A1

Incidentally, electronic devices with low on-resistance are crucial to make power supply devices using electronic devices with epitaxial layers of GaN based compound semiconductors.

Since electron mobility decreases if there is dislocation in the semiconductor crystal, it is necessary to decrease the dislocation density as far as possible especially in the semiconductor operation layer so as to decrease the on-resistance. Here, although the threading dislocation, that is developed in the vicinity of the substrate due to the strain between the substrate and the epitaxial layer and which extends in the upward direction, decreases by disappearing in the buffer layer having a composite lamination as described above, there is some threading dislocation that extends up to the semiconductor operation layer also. Therefore, there is a demand for a technology that will further decrease the dislocation density in the semiconductor operation layer in order to decrease the on-resistance of the electronic devices even more.

SUMMARY OF THE INVENTION

It is an object of the present invention to at least partially solve the problems in the conventional technology.

A semiconductor electronic device according to an aspect of the invention is comprised of: a substrate; a buffer layer formed on said substrate, having two or more layers of composite layers in which a first semiconductor layer comprising nitride based compound semiconductor having smaller lattice constant and greater coefficient of thermal expansion than the substrate and a second semiconductor layer comprising nitride based compound semiconductor having smaller lattice constant and smaller coefficient of thermal expansion than the first semiconductor layer are alternately laminated; a semiconductor operating layer comprising nitride based compound semiconductor formed on said buffer layer; a dislocation reducing layer comprising nitride based compound semiconductor, formed in a location between a location directly under said buffer layer and inner area of said semiconductor operating layer, and comprising a lower layer area and an upper layer area each having an uneven boundary surface, wherein threading dislocation extending from the lower layer area to the upper layer area is bent at said boundary surface.

A method for manufacturing a semiconductor electronic device according to an aspect of the invention is comprised of: a buffer layer forming step for forming a buffer layer on said substrate, having two or more layers of composite layers in which a first semiconductor layer comprising nitride based compound semiconductor having smaller lattice constant and greater coefficient of thermal expansion than the substrate and a second semiconductor layer comprising nitride based compound semiconductor having smaller lattice constant and smaller coefficient of thermal expansion than the first semiconductor layer are alternately laminated; and a semiconductor operating layer forming step for forming a semiconductor operating layer comprised of nitride based compound semiconductor on said buffer layer; and wherein said buffer layer forming step or said semiconductor operating layer forming step includes a dislocation reducing layer forming step for forming a dislocation reducing layer comprised of nitride based compound semiconductor between a location directly under said buffer layer and inside said semiconductor operating layer, formed of a lower layer area having uneven topmost surface and an upper layer area having smooth topmost surface above said lower layer area.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Embodiments embodying the present invention is described with reference to the drawings. Same numerals have been given to same parts in the explanations of all embodiments and repetitive explanations have been omitted.

Embodiment 1

Figure 1:
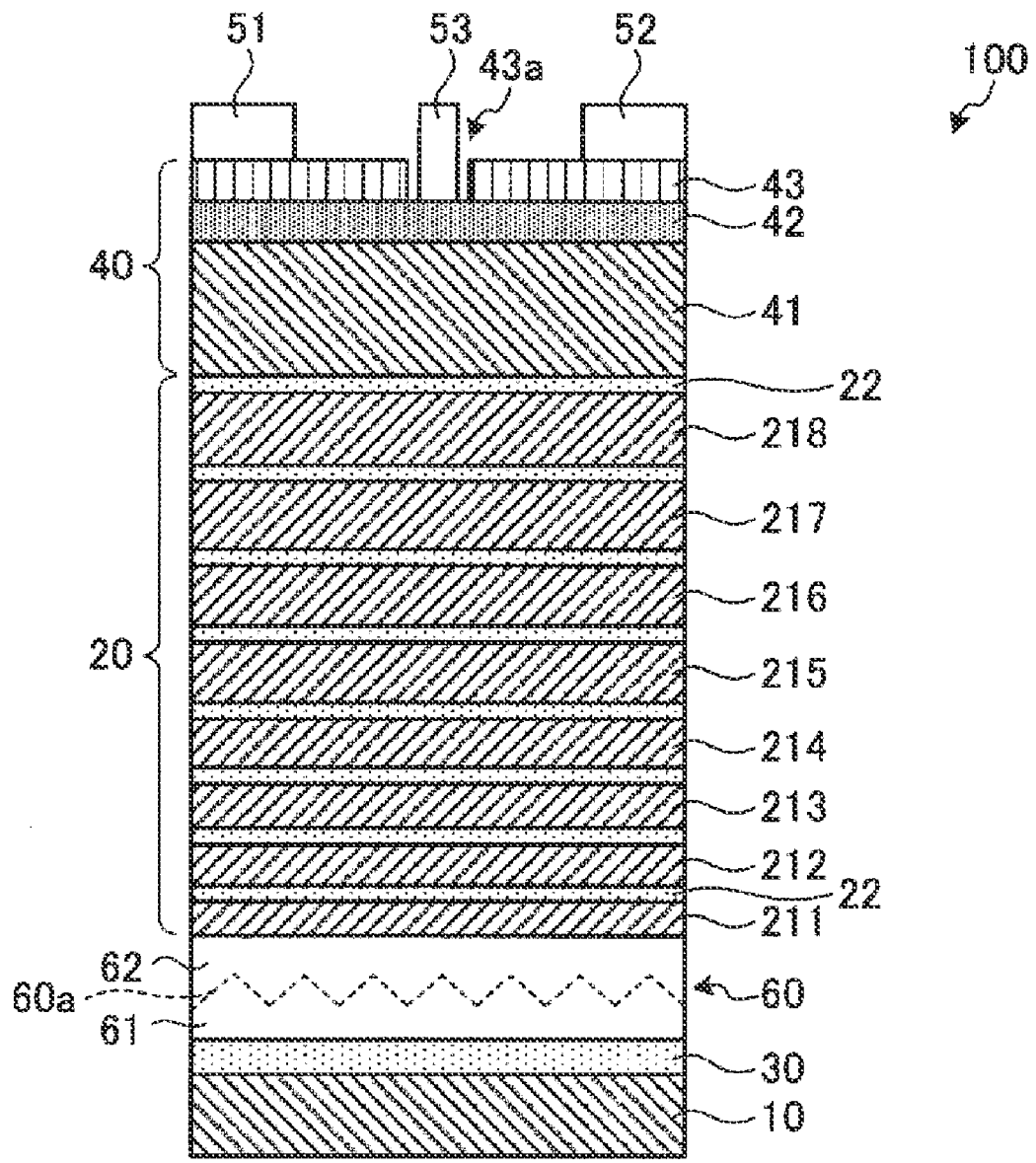
FIG. 1 schematically shows a cross sectional view of a field effect transistor of Embodiment 1.

FIG. 1 schematically shows a cross sectional view of field effect transistor according to Embodiment 1 of the present invention. The field effect transistor 100 is a High Electron Mobility Transistor (HEMT) and is comprised of: a substrate 10 comprising Si single crystal with (111) plane as its main surface; an interstitial layer 30 formed on the substrate 10; a buffer layer 20 formed on the interstitial layer 30; a semiconductor operating layer 40 formed on the buffer layer 20; and a source electrode 51, a drain electrode 52, and a gate electrode 53 formed on the semiconductor operating layer 40; and is further comprised of a dislocation reducing layer 60 formed directly under the buffer layer 20. Apart from dislocation reducing layer 60, the structure of the field effect transistor 100 is almost same as the field effect transistor described as Embodiment 1 in the Detailed Description of Japanese Patent Application Serial No. JP2008-140649 of the present inventors.

More specifically, the interstitial layer 30 is comprised of undoped AlN. The semiconductor operating layer 40 is formed by sequentially laminating an electron transit layer 41 comprised of undoped GaN, an electron supply layer 42 comprised of Si doped n type AlGaN and a contact layer 43 comprised of n+ type GaN. Moreover, both the source electrode 51 and drain electrode 52 have a laminated structure of Ti and Al and are formed on the contact layer 43. Gate electrode 53 has a laminated structure of Pt and Au, and is formed on the electron supply layer 42 through an opening 43a formed on the contact layer 43.

Moreover, the buffer layer 20 is alternately laminated with first semiconductor layers 211, . . . , 218 comprised of undoped GaN and second semiconductor layers 22, . . . , 22 comprised of undoped AlN. If a set of adjoining first semiconductor layer and second semiconductor layer is assumed to be a composite lamination, then the buffer layer 20 has eight such composite laminations. Although Ga and Si form an alloy if the first semiconductor layer 211 comprised of GaN is formed directly on the substrate 10 which is comprised of Si, the alloy formation is advantageously prevented since an interstitial layer 30 is present.

On the other hand, the dislocation reducing layer 60 is comprised entirely of undoped GaN. The dislocation reducing layer 60 has a lower layer area 61 and an upper layer area 62 which have an uneven boundary surface 60a.

The lattice constant of the substrate 10 comprised of Si is 0.384 nm and its coefficient of thermal expansion is $3.59 \times 10^{-6}$/K. On the other hand, the lattice constant of the first semiconductor layers 211, . . . , 218 and dislocation reducing layer 60 comprised of GaN is 0.3189 nm which is smaller than that of the substrate 10, and their coefficient of expansion is $5.59 \times 10^{-6}$/K which is greater than that of the substrate 10. Further, the lattice constant of interstitial layer 30 and second semiconductor layers 22, . . . , 22 comprised of AlN is 0.3112 nm which is smaller than that of the first semiconductor layers 211, . . . , 218, whereas their coefficient of thermal expansion is $4.2 \times 10^{-6}$/K which is greater than that of the substrate 10.

The thickness of the interstitial layer 30, for instance, is 40 nm. The first semiconductor layers 211, . . . , 218 are formed such that the thickness of the layer increases exponentially in the direction of the lamination. Specifically, the thickness of the first semiconductor layer 211 which is the first layer from the substrate 10 is 300 nm and it goes on becoming thicker in the direction of the lamination and the approximate thickness of the first semiconductor layers 212-218 is 352.7 nm, 422.8 nm, 520.1 nm, 663.2 nm, 891.9 nm, 1306 nm and 2237 nm, respectively. On the other hand, the thickness of all the second semiconductor layers 22, . . . , 22 is same at 60 nm. Therefore, the thickness of the buffer layer 20 is approximately 7.18 μm. Moreover, the thickness of the dislocation reducing layer 60 is 1500 nm, thickness of the semiconductor operating layer 40 is 1.35 μm and the total thickness of the epitaxial layer combined with the buffer layer 20 is approximately 10 μm.

As described above, the field effect transistor 100, is manufactured by epitaxial crystal growth method such as MOCVD process wherein an interstitial layer 30, a dislocation reducing layer 60, a buffer layer 20 and a semiconductor operating layer 40 are formed sequentially for instance on a 4 inch diameter substrate, and separated for devices after forming a source electrode 51, a drain electrode 52 and a gate electrode 53.

Since the structure of the field effect transistor 100 is as described above, this device has a low on-resistance with small warp.

The present invention is described hereafter in detail. How the on-resistance of the field effect transistor 100 has been lowered is described first and how the warp has been decreased is described thereafter.

To start with, the method of reducing the on-resistance of the field effect transistor 100 is described. The on-resistance of the field effect transistor 100 has been reduced by decreasing the threading dislocation density in the electron transit layer 41 by providing a dislocation reducing layer 60.

Figure 2:
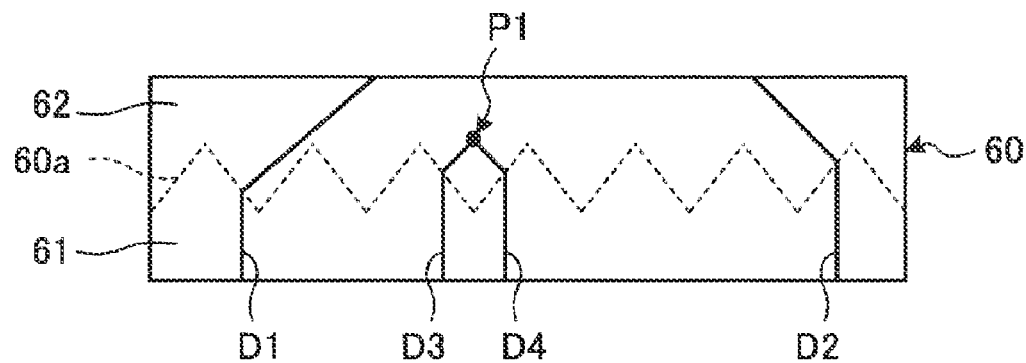
FIG. 2 shows an explanatory diagram of the function of the dislocation reducing layer.

FIG. 2 is an explanatory diagram of the function of the dislocation reducing layer 60. As shown in FIG. 2, the threading dislocations D1 and D2 developed in the vicinity of the substrate 10 extend in the lower layer area 61 of the dislocation reducing layer 60 towards the lamination direction bending it at the inclined plane of the uneven boundary surface 60a and extend the upper layer area 62 further to buffer layer 20 that is positioned just above the dislocation reducing layer 60.

We suppose the threading dislocations D3 and D4 have Burgers vectors in mutually opposite directions. These threading dislocations D3 and D4 also extend in the lower layer area 61 in the upward direction and bend at the inclined plane of the boundary surface 60a, but meet at point P1 inside the upper layer area 62. Since these threading dislocations D3 and D4 have Burgers vector in mutually opposite directions, they disappear at point P1 and do not reach the buffer layer 20. Even if they do not disappear at point P1, the size of the Burgers vectors becomes small and as such they disappear easily midway while extending in the upward direction.

In other words, the dislocation reducing layer 60 bends the threading dislocation at the uneven boundary surface 60a and improves the probability of the meeting of the threading dislocations and thereby improves the probability of disappearance or reduction in the size of the dislocations due to the threading dislocations negating among themselves which have Burgers vectors in mutually opposite directions. As a result, there is a decrease in the threading dislocations that reach the buffer layer 20 and further up to the semiconductor operating layer 40, and as such, the threading dislocation density in the semiconductor operating layer 40, and particularly in the electron transit layer 41 is reduced. As a result, the on-resistance in the electric field transistor 100 is lowered.

Figure 3:
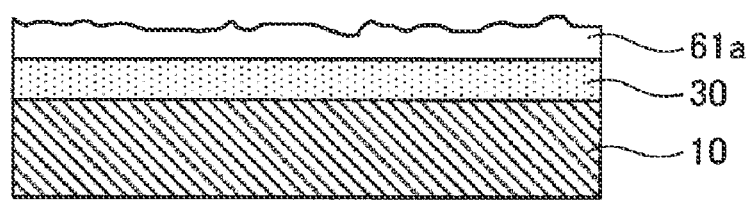
FIG. 3 shows an explanatory diagram of an example of the method of forming the dislocation reducing layer.
Figure 4:
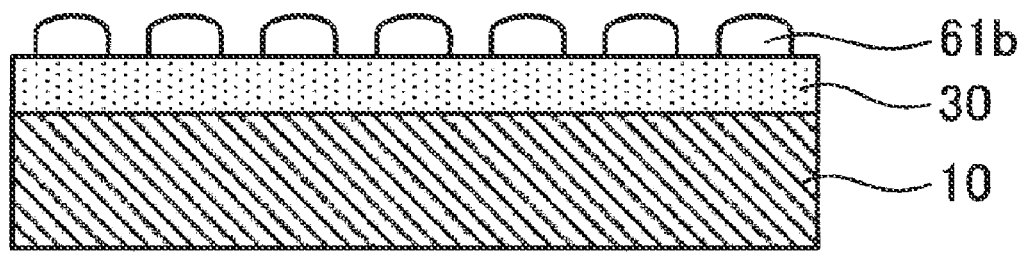
FIG. 4 shows an explanatory diagram of an example of the method of forming the dislocation reducing layer.
Figure 5:
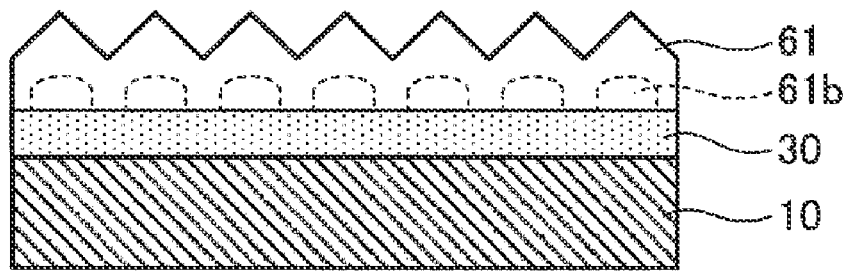
FIG. 5 shows an explanatory diagram of an example of the method of forming the dislocation reducing layer.
Figure 6:
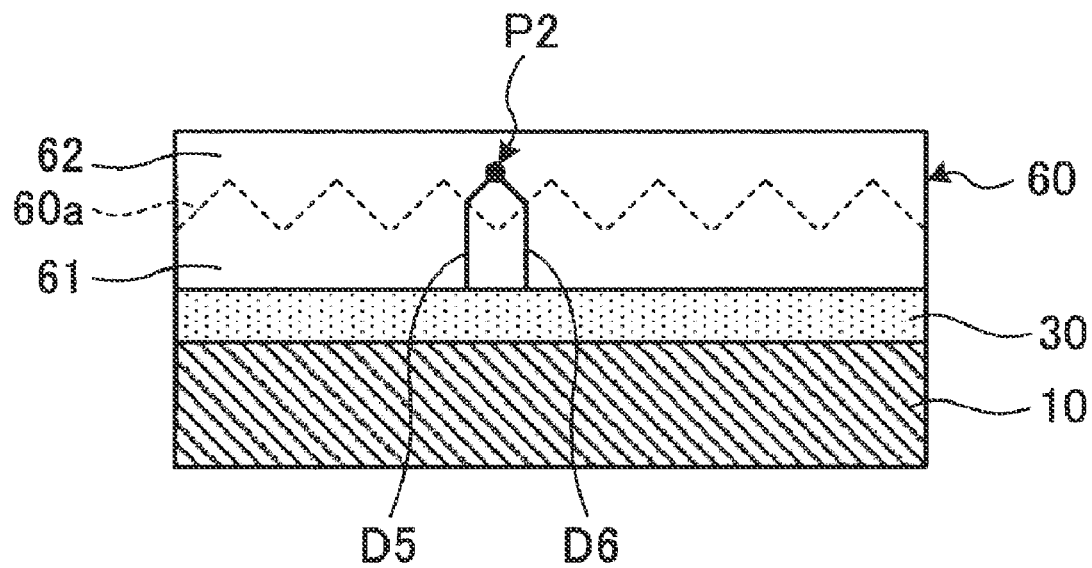
FIG. 6 shows an explanatory diagram of an example of the method of forming the dislocation reducing layer.

The dislocation reducing layer 60 is formed as given below. FIGS. 3-6 are explanatory diagrams of an example of the method of forming the dislocation reducing layer 60. First, the substrate temperature is set at 400-600° C. and an approximately 400 nm thick amorphous layer 61a comprised of undoped GaN is formed on the interstitial layer 30 as shown in FIG. 3. Then, island-shaped nuclei 61b are formed from the amorphous layer 61a as shown in FIG. 4 by increasing the substrate temperature to 850-950° C. These nuclei 61b have an island structure with a plurality of facets sloping against the surface of interstitial layer 30. Then, approximately 1000 nm thick lower layer area 61 comprised of undoped GaN, is formed such that it covers the growth nuclei 61b. The topmost surface of this lower layer area 61 is uneven to reflect the shape of the growth nucleus 61b. Then, the substrate temperature is raised to 950-1050° C. and the upper layer area 62 comprised of undoped GaN is formed over the lower layer area 61 thus constituting the dislocation reducing layer 60 as shown in FIG. 6. The topmost surface of the upper layer area 62 becomes smooth because the formation of the upper layer area 62 is carried out under conditions, which promote the crystal growth in the horizontal direction. In this case, since the threading dislocations extend perpendicular to the growth surface, the threading dislocations D5 and D6 bend at the topmost surface of the lower layer area 61, i.e. at the boundary surface 60a. Here, the threading dislocations D5 and D6 have mutually opposite direction Burgers vectors that meet and disappear at point P2. Furthermore, the lower layer area 61 and the upper layer area 62 are made of semiconductor materials that have the same composition, and the crystal structure, etc. continue even at the boundary surface 60a. However, if the cross section of the dislocation reducing layer 60 is observed with an electron microscope, etc., the position and shape of the boundary surface 60a can be easily identified since boundary surface with many bent threading dislocations can be observed.

In the following, the high pressure resistance and the low warp of the electric-field effect transistor 100 is described. Hereafter, convex warp of the substrate 10 is defined as "plus direction" warp and concave warp is defined as "minus direction" warp.

Upon the electric field effect transistor 100 is manufactured, the interstitial layer 30, the buffer layer 20, and the semiconductor operating layer 40 are formed at a substrate temperature of about 1000-1100° C. Here, when the interstitial layer 30 is formed on the substrate 10, warp is developed in the minus direction because the lattice constant of the interstitial layer 30 is smaller than that of the substrate 10. Then, if the first semiconductor layer 211 of the first layer is formed on the interstitial layer 30 through the dislocation reducing layer 60, warp is developed in the plus direction as long as the thickness of the first semiconductor layer 211 is thin because the lattice constant of the first semiconductor layer 211 is greater than that of the interstitial layer 30. However, if the thickness of the first semiconductor layer 211 is greater than or equal to a certain thickness, a minus direction warp is developed to negate the plus direction warp because the lattice constant of the first semiconductor layer 211 is smaller than that of substrate 10. Hereafter, the thickness of the semiconductor layer when the direction of warp developed by the semiconductor layer reverses with respect to the epitaxial substrate is called "critical thickness". In other words, the critical thickness signifies the thickness at the point where the warp is the maximum with respect to the change in the thickness of the semiconductor layer.

Then, if the second semiconductor layer 22 is formed on the first semiconductor layer 211, warp is developed in the minus direction because the lattice constant of the second semiconductor layer 22 is smaller than that of the first semiconductor layer 211.

Then, if the first semi-conductor layer 212 is formed on the second semiconductor layer 22, as with the case of the first semiconductor layer 211, warp is developed in the plus direction as long as the thickness of the first semiconductor layer 212 is thin, but a minus direction warp is developed if the thickness of the semiconductor layer 212 exceeds a certain critical thickness. However, the critical thickness of the first semiconductor layer 212 becomes thicker than the critical thickness of the second semiconductor layer 211. The possible reason is that the first semiconductor layer 212 is affected by the semiconductor layers which are the interstitial layer 30, the dislocation reducing layer 60, the first semiconductor layer 211 and the second semiconductor layer 22 (underlying layer) formed under it.

If the thickness of the first semiconductor layer 212 and the thickness of the second semiconductor layer 211 are same, the warp that is developed in minus direction in the first semiconductor layer 212 becomes small. However, as described above, in the present Embodiment 1, the first semiconductor layer 212 is formed thicker than the first semiconductor layer 211. As a result, even if the critical thickness of first semiconductor layer 212 is greater than the critical thickness of the first semiconductor layer 211, the minus direction warp that is developed in the first semiconductor layer 212 is maintained at a high level.

Similarly, as the first semiconductor layers 213, 214, . . . are formed with the second semiconductor layers 22 placed in between, the total thickness of the underlying layers becomes thicker thereby increasing critical thickness. On the other hand, in the field effect transistor 100, the thickness of the first semiconductor layers 213, 214, . . . , 218 increases in the lamination direction, and the thickness of each of the first semiconductor layers 213, 214, . . . , 218, is greater than the critical thickness at that lamination position. As a result, since the minus direction warp developed for each of the first semiconductor layers 211, . . . , 218 is maintained at a higher level, the warp developed in plus direction is negated and becomes extremely small.

Finally, the semiconductor operating layer 40 is formed and the epitaxial growth is completed, but a plus direction warp is developed in the semiconductor operating layer 40 as the whole. Thereafter, when the substrate temperature is brought back to normal temperature from 1000-1100° C., a minus direction warp is developed as the substrate temperature is lowered because the fact that the coefficients of thermal expansion of all the buffer layer 20, the dislocation reducing layer 60, the interstitial layer 30 and the semiconductor operating layer 40 are greater than that of the substrate 10, and consequently, the ultimate warp becomes a small value. As a result, the pressure resistance can also be improved since the total thickness of the epitaxial layer can be kept greater even while controlling the warp.

As described above, the field effect transistor 100 has a small warp and at the same time has improved pressure resistance since the total thickness of the epitaxial layers over the substrate 10 is thin. Additionally, since the warp in each of the first semiconductor layers 211, . . . , 218 is negated, it advantageously results in significantly reducing the subtended strain.

Furthermore, in the present Embodiment 1, although the thickness of the thinnest first semiconductor layer 211 is 300 nm, minus direction warp can be developed if the thickness is greater than or equal to 200 nm. Moreover, if the thickness is greater than or equal to 400 nm, the amount of warp developed in minus direction can be enlarged sufficiently, which is more preferable. If the thickness of each of the first semiconductor layers 211, . . . , 218 is less than or equal to 3000 nm, the productivity is high since the growth time is sufficiently shortened, which is desirable.

If the thickness of the second semiconductor layer 22 is more than or equal to 0.5 nm and less than or equal to 200 nm, the strain subtended in the first semiconductor layer 211, . . . , 218 can be controlled sufficiently, which is desirable.

Moreover, the thickness of the first semiconductor layers 211, . . . , 218, the second semiconductor layers 22, . . . , 22, and the interstitial layer 30 is not limited to the value in the above-mentioned Embodiment 1, and their thickness may be properly set depending on their compositions, the difference between their lattice constants and coefficients of thermal expansion with those of the substrate 10, pressure resistance required for the device, permissible degree of warp, etc.

Moreover, the preferable thickness of the dislocation reducing layer 60 is greater than or equal to 100 nm so as to form a sufficiently uneven shape in order to obtain sufficient dislocation reducing effect and to achieve a plane surface and the thickness should preferably be less than or equal to 3000 nm so as to improve the productivity.

Variant Examples 1-4

Although the dislocation reducing layer 60 is formed directly under the buffer layer 20 in the field effect transistor 100 according to the above Embodiment 1, the position of the dislocation reducing layer 60 is not limited to this, and its dislocation reducing effect can be demonstrated if the dislocation reducing layer 60 is formed at any position from directly under the buffer layer 20 up to inside the electron transit layer 41. Hereafter, the semiconductor electronic devices with dislocation reducing layer 60 formed at various positions are described as Variant Examples 1-4 of Embodiment 1.

Variant Example 1

Figure 7:
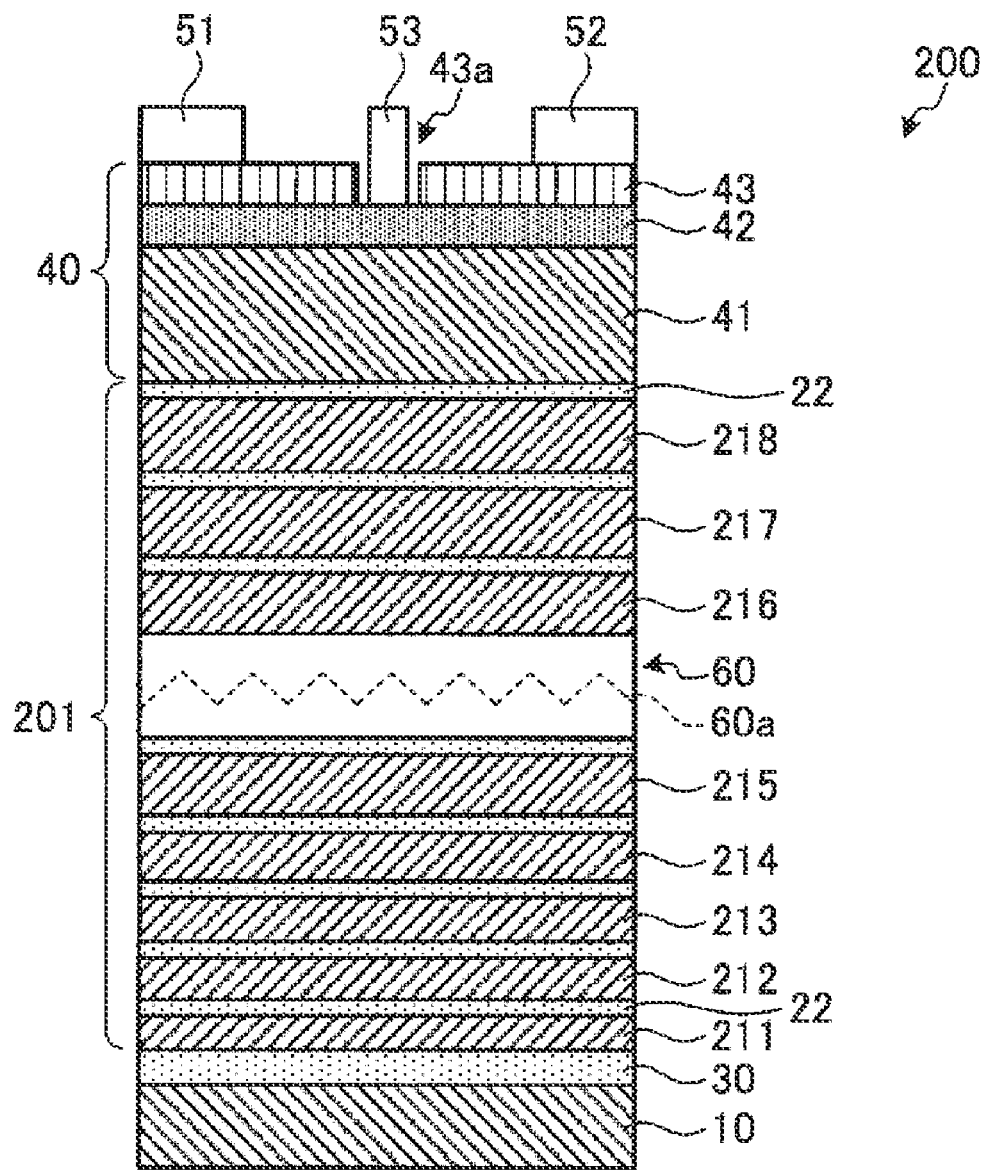
FIG. 7 shows the dislocation density of screw dislocation at a location where the thickness from the substrate surface has been measured in the field effect transistor of Examples 1-3 and Comparative Example 1.

FIG. 7 is a cross sectional view of the field effect transistor of Variant Example 1. The field effect transistor 200 has a structure wherein the buffer layer 20 of field effect transistor 100 shown in FIG. 1 is replaced with buffer layer 201. Although the buffer layer 201 has a configuration wherein the first semiconductor layers 211, . . . , 218 and the second semiconductor layers 22, . . . , 22, having the same composition as the buffer layer 20, are alternately laminated, the dislocation reducing layer 60 having an uneven boundary surface 60a, is formed at the position directly under the first semiconductor layer 216 in the buffer layer 201. As a result, the field effect transistor 200 also has the same functions as that of the field effect transistor 100 and is a device that has small warp, low on-resistance, and even improved pressure resistance. Moreover, dislocation reducing layer 60 of the field effect transistor 200 is formed at the position where at least one first semiconductor layer lies in between the dislocation reducing layer 60 and the substrate 10. In case of such a composition, since the threading displacement developed in the proximity of the substrate 10 is temporarily reduced by at least one first semiconductor layer, the threading dislocation disappears even more easily in the dislocation reducing layer 60 thereby lowering the on-resistance even further, which is desirable. However, as a further variation, if the dislocation reducing layer 60 is formed in a position where at least one first semiconductor layer and/or second semiconductor layer is interposed in between the dislocation reducing layer 60 and the substrate 10, then the field effect transistor accomplishes the same effects the Variant Example 1.

Variant Example 2

Figure 8:
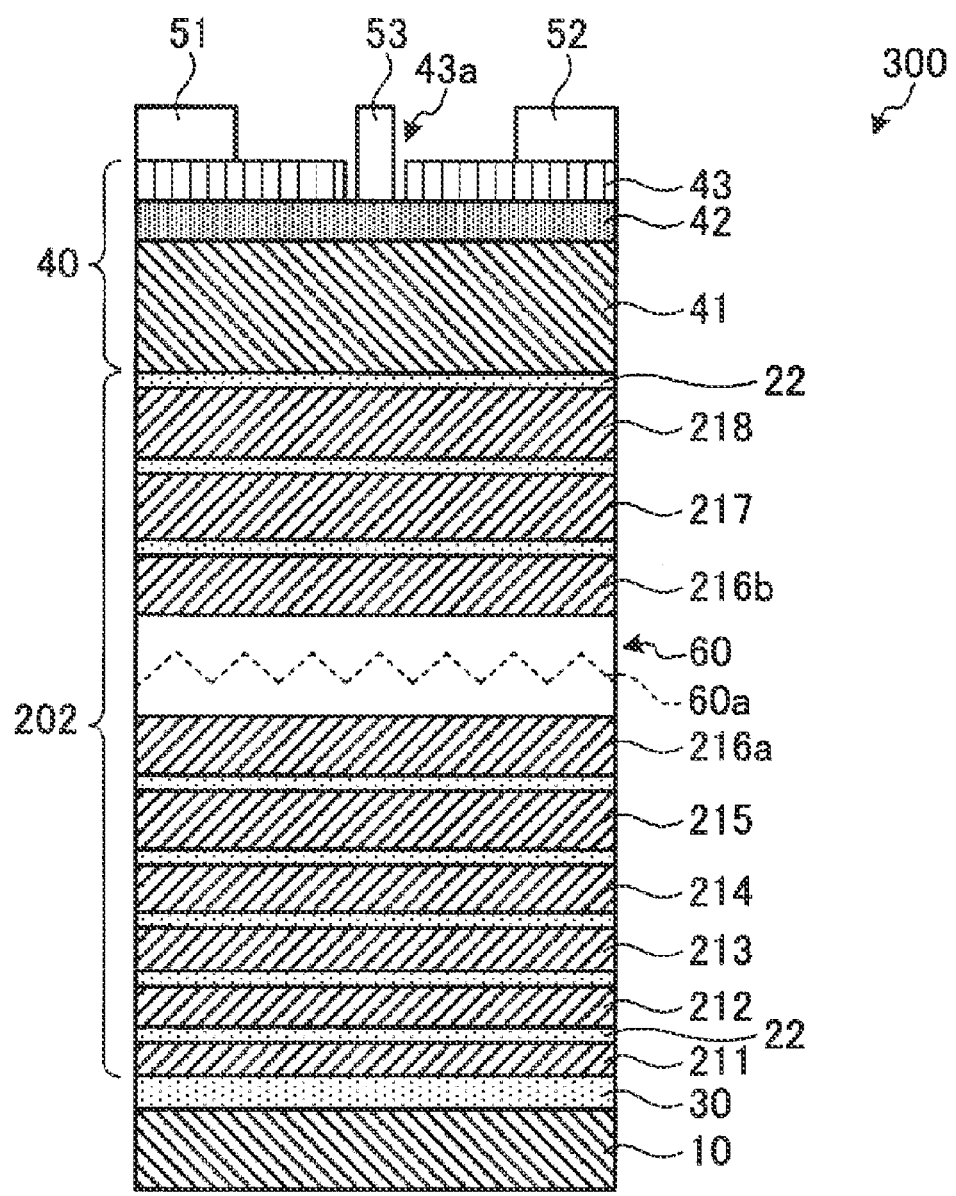
FIG. 8 shows the dislocation density of edge dislocation at a location where the thickness from the substrate surface has been measured in the field effect transistor of Examples 1-3 and Comparative Example 1.

FIG. 8 is a cross sectional view of the field effect transistor of Variant Example 2. The field effect transistor 300 has the structure in which the buffer layer 20 of field effect transistor 100 shown in FIG. 1 is replaced with buffer layer 202. Although the buffer layer 202 has the same structure as that of the buffer layer 20, the layer corresponding to the first semiconductor layer 216 in the buffer layer 20 is divided into the first semiconductor layer 216a and the first semiconductor layer 216b, and the dislocation reducing layer 60 having an uneven boundary surface 216a is formed in the position between the first semiconductor layer 216a and first semiconductor layer 216b. As a result, the field effect transistor 300 also has the same functions as the field effect transistors 100 and 200 and is a device that has small warp, low on-resistance, and even higher pressure resistance. Moreover, since the dislocation reducing layer 60 of the field effect transistor 300 is also formed in the position where at least one first semiconductor layer lies in between the dislocation reducing layer 60 and the substrate 10, the threading dislocation disappears more easily in the dislocation reducing layer 60 thereby reducing the on-resistance even further, which is desirable.

Variant Example 3

Figure 9:
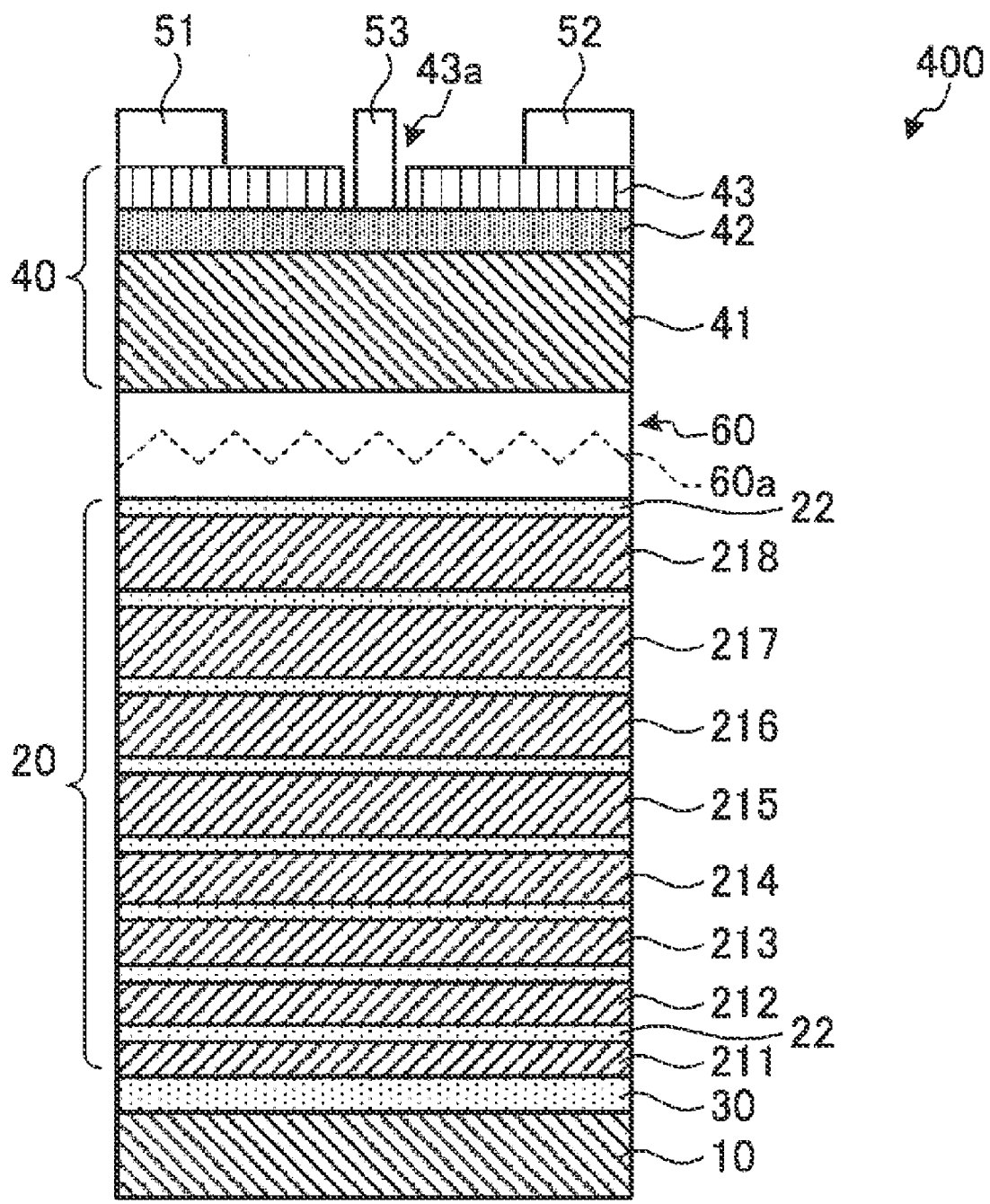
FIG. 9 shows the dislocation density of screw and edge dislocation at a location where the thickness in the semiconductor operating layer is 9.5 μm of Examples 1-3 and Comparative Example 1.

FIG. 9 schematically shows a cross-sectional view of the field effect transistor of Variant Example 3. The field effect transistor 400 has the structure wherein the dislocation reducing layer 60 is constructed directly under the semiconductor operating layer 40 in the field effect transistor 100 shown in FIG. 1. As a result, the field effect transistor 400 also has a small warp and an improved pressure resistance, and its threading dislocation disappears effectively just before the semiconductor operating layer 40 due to the dislocation reducing layer 60, and thereby, the device has an even lower on-resistance.

Variant Example 4

Figure 10:
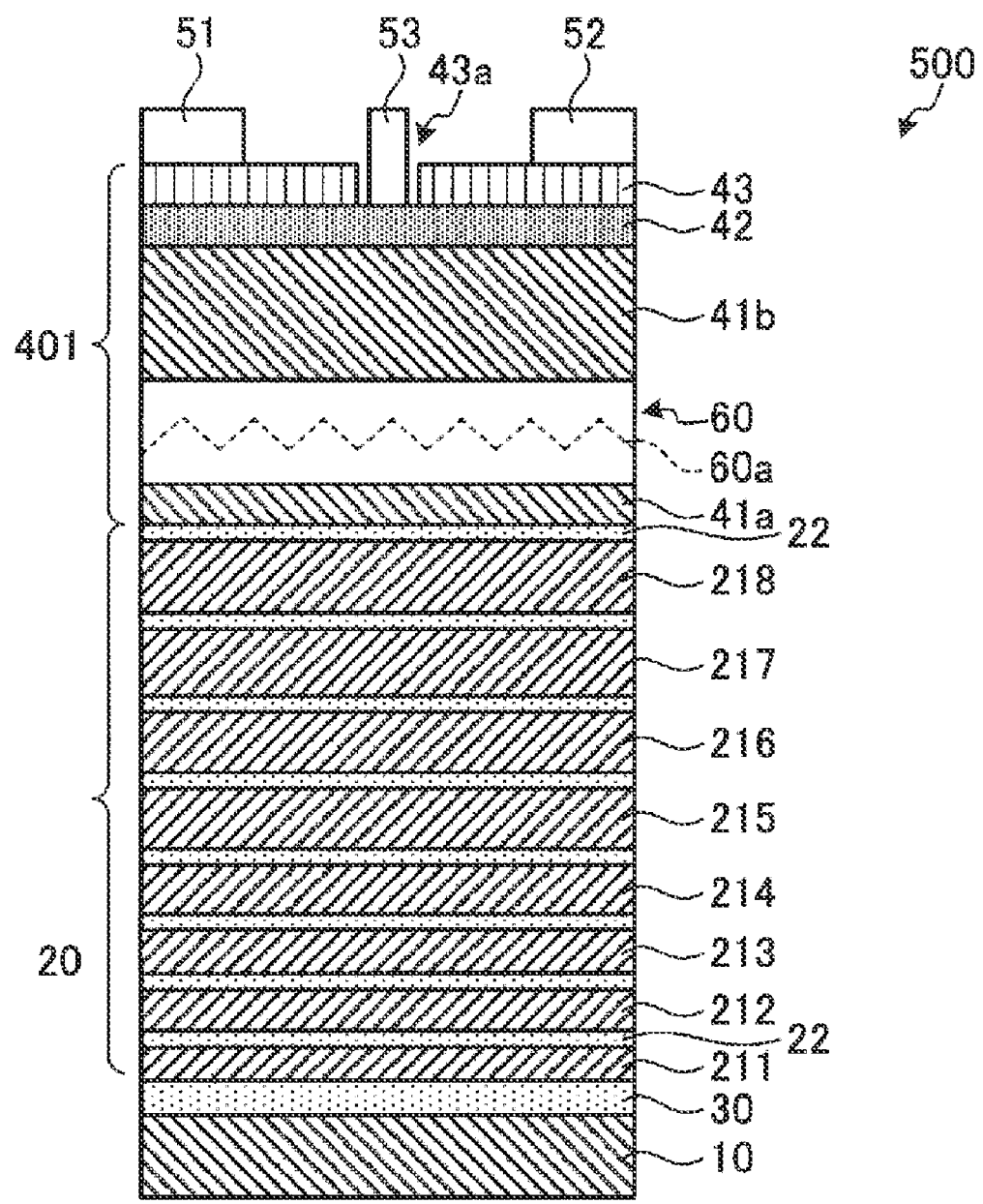
FIG. 10 schematically shows a cross sectional view of the field effect transistor of Embodiment 2.

FIG. 10 schematically shows a cross-sectional view of the field effect transistor of Variant Example 4. The field effect transistor 500 has the structure wherein the semiconductor operating layer 40 of the field effect transistor 100 shown in FIG. 1 is replaced with a semiconductor operating layer 401. Although the semiconductor operating layer 401 has the same structure as that of the semiconductor operating layer 40, the layer corresponding to the electron transit layer 41 of the semiconductor operating layer 40 is divided into electron transit layer 41a and electronic transit layer 41b. The dislocation reducing layer 60 with an uneven boundary surface 60a is formed at the position between the electron transition layer 41a and the electron transition layer 41b in the semiconductor operating layer 401. Although it is the electron transit layer 41b which the electrons actually transit, the thickness of this layer is such that there is no adverse effect on the transition of electrons. As a result, the field effect transistor 500 also has a small warp and an improved pressure resistance, and the threading dislocation also disappears more effectively just before the semiconductor operating layer 41b due to the dislocation reducing layer 60, and as such, this device has an even lower on-resistance.

Examples 1-3 and Comparative Example 1

Field-effect transistors were manufactured according to Embodiment 1 and its Variant Examples 1, 3 as Examples 1-3 of the present invention and their dislocation density at the positions in the laminating direction was measured with a Transmission Electron Microscope (TEM). On the other hand, as Comparative Example 1, instead of the dislocation reducing layer in the structure of Embodiment 1, the field effect transistor was manufactured with a uniformly developed undoped GaN layer of the same thickness of 1500 nm as the dislocation reducing layer, and its dislocation density at positions in laminating direction was measured with TEM.

Figure 11:
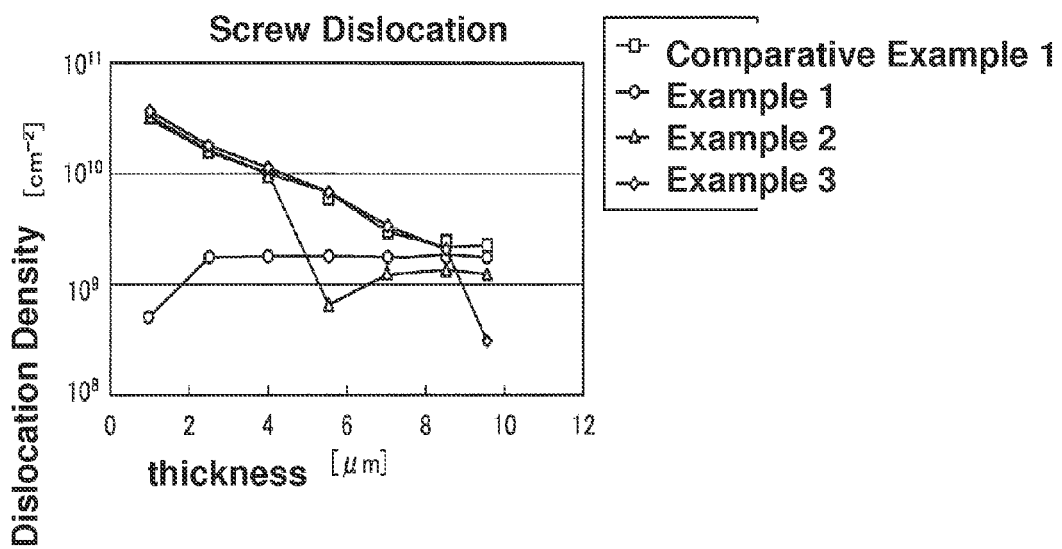
FIG. 11 schematically shows a cross sectional view of the field effect transistor according to Embodiment 3.
Figure 12:
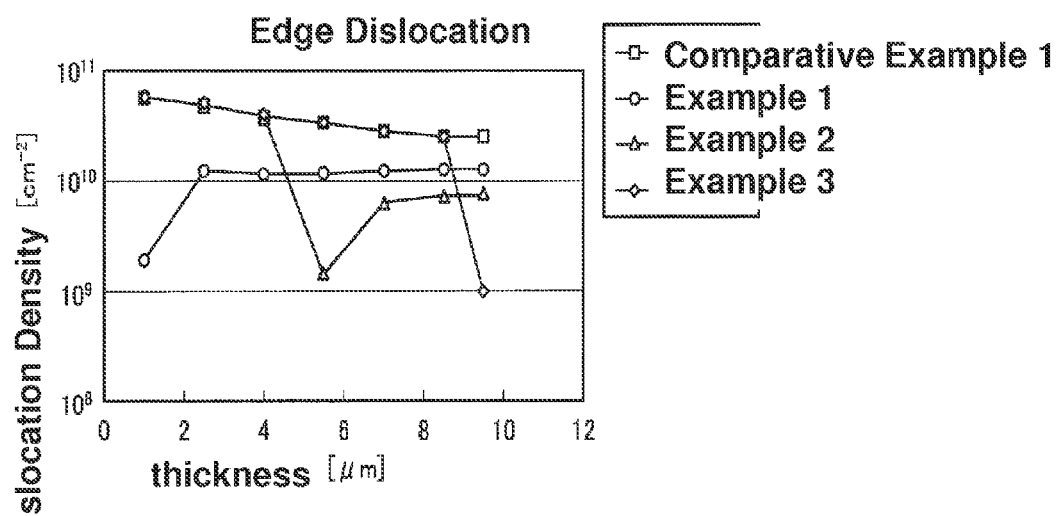
FIG. 12 shows the edge dislocations in the field effect transistors of some comparative examples.

FIG. 11 shows the dislocation densities of screw dislocations in the field effect transistors of Examples 1-3 and Comparative Example 1 at the positions where the thickness from the substrate surface was measured. FIG. 12 shows the edge dislocations in the field effect transistors of Examples 1-3 and Comparative Example 1 at the position where thickness from the substrate surface was measured. As shown in FIGS. 11 and 12, in Comparative Example 1, each of the dislocation density was higher at positions near the substrate where the thickness was less i.e., about 1 μm, and the dislocation density reduced as the thickness increased. In Example 1, since the dislocation reducing layer is formed at the position near the substrate, each dislocation density was greatly reduced at thickness of about 1 μm and the density remained low even if the thickness was increased. Moreover, in Example 2, although each dislocation density was higher than that in the Comparative Example 1 at positions where the thickness was about 1 μm, each dislocation density decreased due to the thickness of the layers at positions above the dislocation reducing layer and the density remained low even when the thickness increased. In Example 3, although the trend was same as the Comparative Example 1 up to the thickness of the position corresponding to the buffer layer, each dislocation density decreases rapidly due to the thickness of the position above the dislocation layer and each dislocation densities reduced greatly due to the thickness at the position of the semiconductor operating layer.

Figure 13:
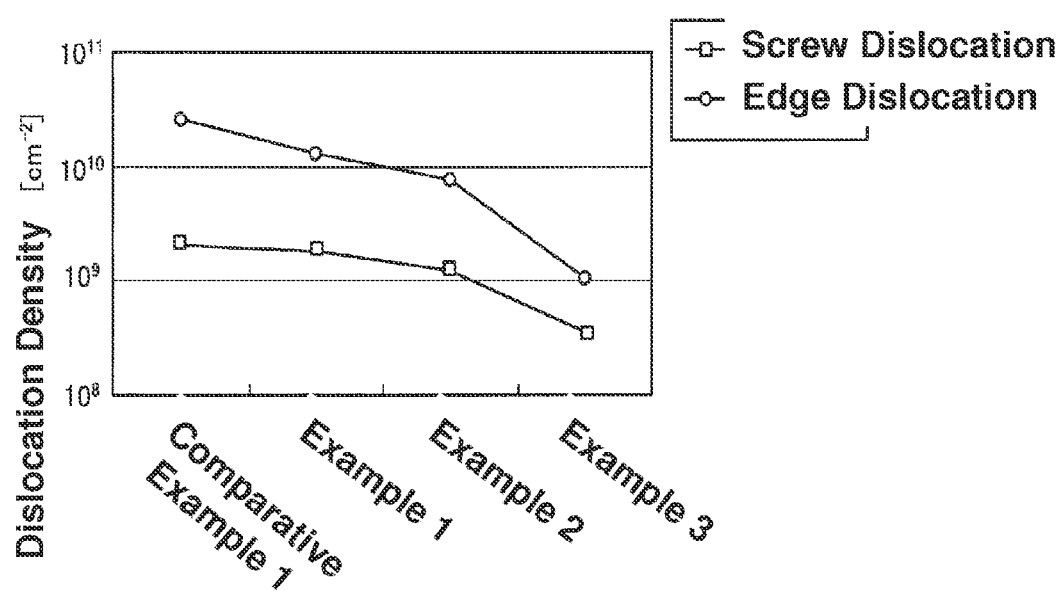
FIG. 13 shows the dislocation densities of screw dislocations and edge dislocations for some comparative examples.

FIG. 13 shows the dislocation densities of screw dislocations and edge dislocations for Examples 1-3 and Comparative Example 1 at positions where the thickness from the substrate was approximately 9.5 μm in the semiconductor operating layer. As shown in FIG. 13, each of the dislocation densities in Examples 1-3 was lower than those in Comparative Example 1 and it was confirmed that each of the dislocation densities is reduced even further as the position of the dislocation reducing layer gets closer to the semiconductor operating layer.

Embodiment 2

Figure 14:
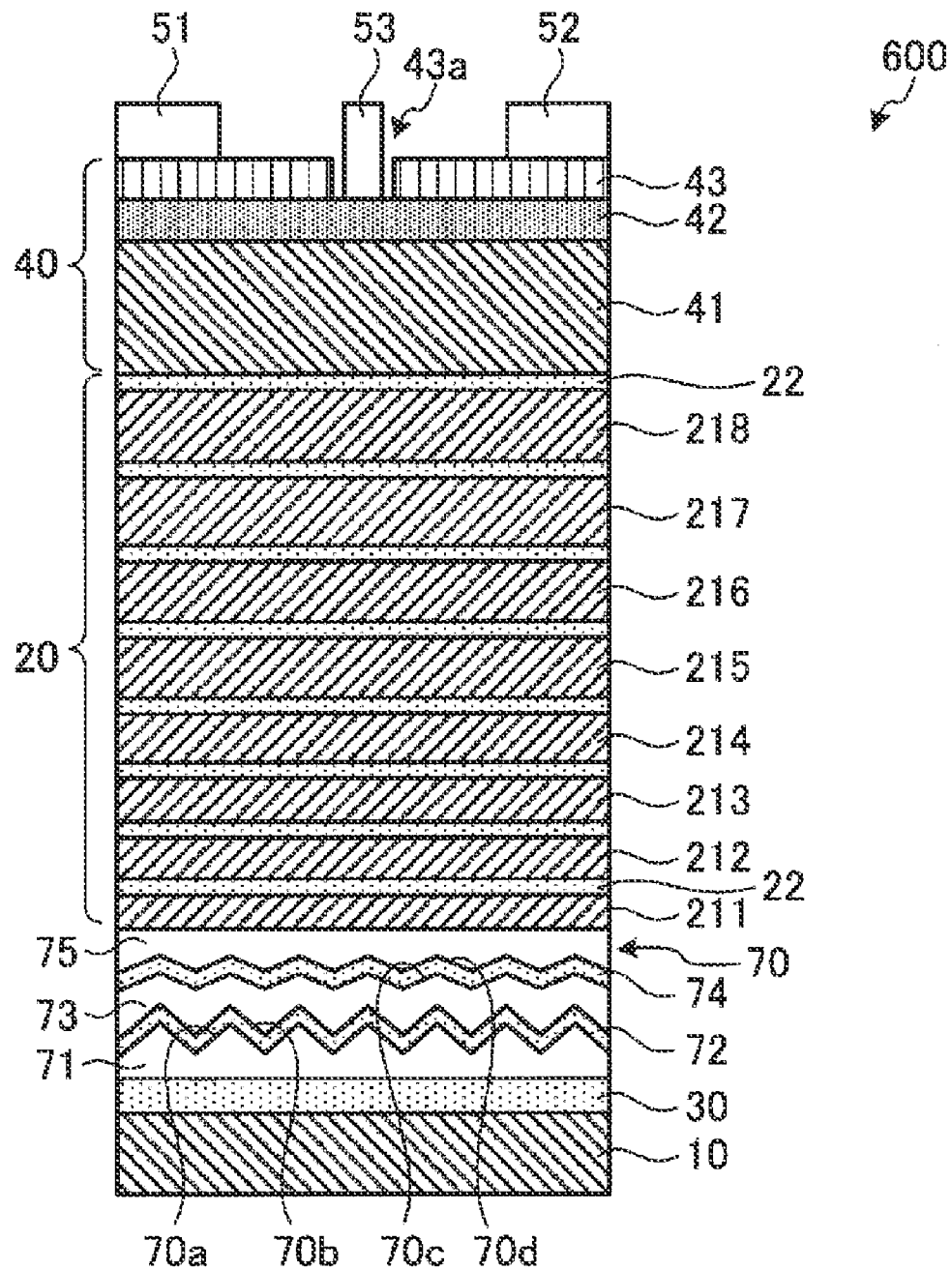
FIG. 14 is a cross-sectional view of the field effect transistor of an embodiment.

In the following, Embodiment 2 of the present invention is described. FIG. 14 is a cross-sectional view of the field effect transistor of Embodiment 2. The field effect transistor 600 has a structure wherein the dislocation reducing layer 60 of the field effect transistor 100 shown in FIG. 1 is replaced with a dislocation reducing layer 70. The dislocation reducing layer 70 has a structure wherein a lower layer area 71, a warp reducing layer 72, a first upper layer area 73, a warp reducing layer 74, and a second upper layer area 75 are layered sequentially. The lower layer area 71, the first upper layer area 73, and the second upper layer area 75 are all comprised of undoped GaN. The warp reducing layers 72 and 74 are comprised of undoped AlN.

In the dislocation reducing layer 70 of the field effect transistor 600, since the boundary surface 70a, between the lower layer area 71 and the area above it comprising of the warp reducing layer 72 to the second upper layer area 75, is uneven, the threading dislocations extending from the lower side bend at the inclined plane of the boundary surface 70a reducing the threading dislocation density in the electron transit layer 41 similar to the field effect transistor 100 and thereby lowering the on-resistance.

Since the dislocation reducing layer 70 is formed by alternately laminating the lower layer area 71, first upper layer area 73 and second upper layer area 75 each comprised of GaN, and warp reducing areas 72 and 74 comprised of AlN, the warp is controlled by the function same as that of buffer layer even if the thickness of dislocation reducing layer 70 increases. The number of such warp reducing layers is not restricted to 2 and there can be a plurality of such warp reducing layers.

Moreover, the dislocation reducing layer 70 can be formed by changing the growth material to suitable material by using the method same as dislocation reducing layer 60 of field effect transistor 100. Since the area from the warp reducing area 72 to the second upper layer area 75 is formed with conditions that promote crystal growth in the horizontal direction, the inclination of the uneven structure of the boundary surfaces 70c, 70d is more gradual than the inclination of the uneven boundary surface 70a and 70b.

Embodiment 3

Figure 15:
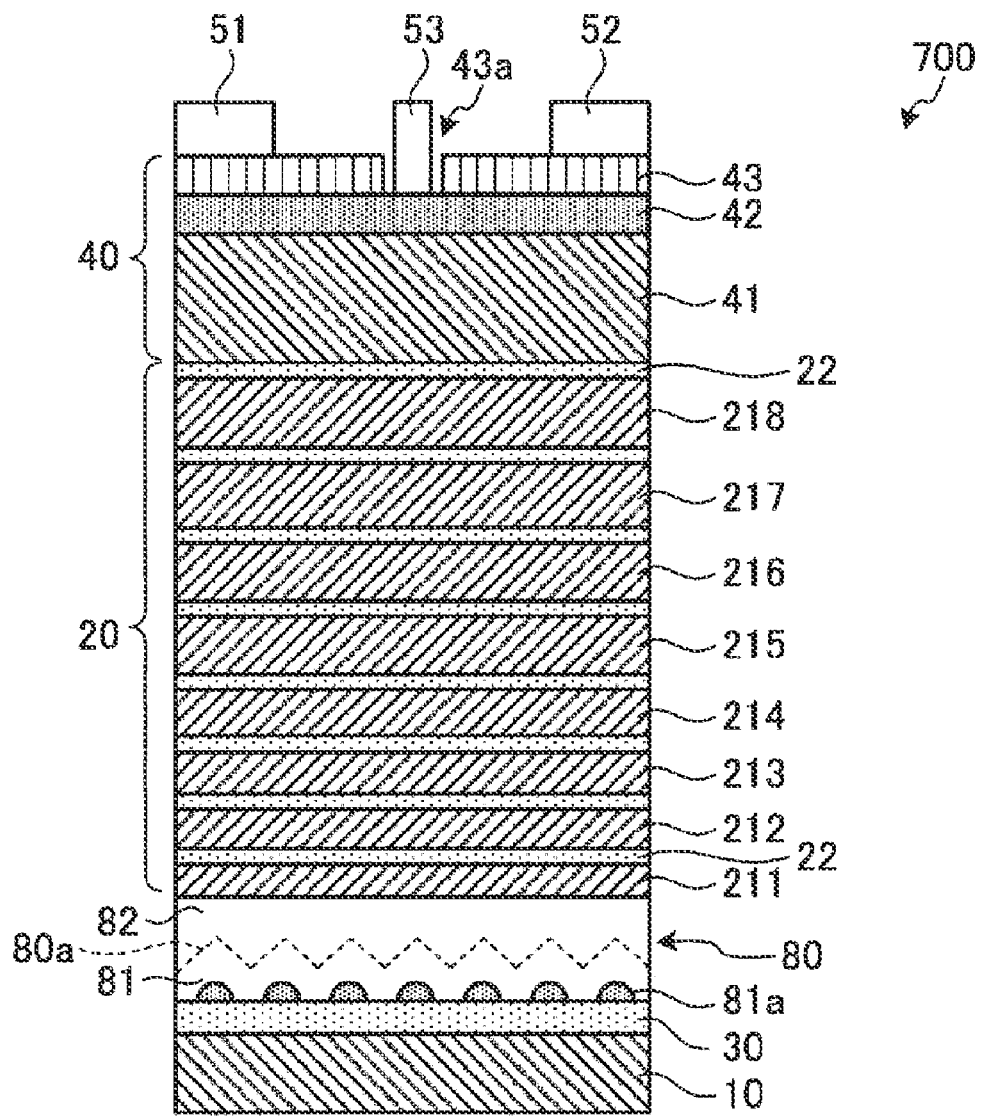
FIG. 15 is a cross sectional view of the field effect transistor according to another embodiment.

In the following, Embodiment 3 of the present invention is described. FIG. 15 is a cross sectional view of the field effect transistor according to Embodiment 3 of the present invention. The field effect transistor 700 has a structure wherein the dislocation reducing layer 60 of the field effect transistor 100 shown in FIG. 1 is replaced with a dislocation reducing layer 80. The dislocation reducing layer 80 has a lower layer area 81 and a upper layer area 82 which have an uneven boundary surface 80a. The lower layer area 81 has approximately 5 nm thick island-shaped nucleus 81a comprised of silicon nitride or silicon oxide at the bottom and is comprised of undoped GaN formed to cover the growth nucleus 81a. Moreover, upper layer area 82 is comprised of undoped GaN.

In the dislocation reducing layer 80 of the field effect transistor 700, the uneven boundary surface 80a is formed of island-shaped nucleus 81a comprised of silicon nitride or silicon oxide. Since silicon nitride or silicon oxide easily form island-shaped nucleus 81a in the initial stage of the growth, the field effect transistor 700 is a device that has small warp, low on-resistance, improved pressure resistance and its productivity is also improved. The island-shaped nuclei 81a can be formed by using vapor phase growth methods such as various CVD methods, etc.

Although a substrate comprising of Si is used in each of the embodiments mentioned above, substrates comprising of SiC or ZnO can also be used. Further, with respect to material for each area in the dislocation reducing layer and for warp reducing layer, interstitial layer, first and second semiconductor layer, the material is not limited as long as it is nitride based compound semiconductor and the lattice constants and coefficient of thermal expansions for the layers and the substrate satisfies a predetermined relation. For instance, in each of the above-described embodiments, the second semiconductor layer is comprised of AlN, but it can be of $Al_xGa_{1-x}N$ (wherein 0<x<1) as well.

Moreover, in the above-described embodiments, although the semiconductor electronic device was HEMT type field effect transistor, the present invention is not limited to this type, and is applicable to various field effect transistors such as insulated gate type (MIS type and MOS type) and Schottky gate type (MES type), etc. Moreover, the present invention is applicable to various diodes such as Schottky diodes besides the field effect transistor. For instance, if the structure of the field effect transistor 100 of Embodiment 1 is formed with cathode electrode and anode electrode instead of the source electrode 51, the drain electrode 52 and the gate electrode 53, diodes according to the present invention can be achieved. In addition, if the dislocation reducing layer is formed inside the semiconductor operating layer when applying the present invention to various semiconductor electronic devices, the dislocation reducing layer should be formed in a position which will not affect the operating characteristics of the device as is with the Variant Example 4 shown in FIG. 10.

In accordance with the present invention, the warp is reduced due to the buffer layer and threading dislocation density in the semiconductor operating layer is reduced due to the dislocation reducing layer, and thereby, a semiconductor electronic device with small warp and low on-resistance is advantageously accomplished.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor electronic device comprising:
a substrate;
a buffer layer formed on said substrate, having two or more layers of composite layers in which a first semiconductor layer comprising a nitride based compound semiconductor having a smaller lattice constant and a greater coefficient of thermal expansion than the substrate and a second semiconductor layer comprising a nitride based compound semiconductor having a smaller lattice constant and a smaller coefficient of thermal expansion than the first semiconductor layer are alternately laminated;
a semiconductor operating layer comprising a nitride based compound semiconductor formed on said buffer layer; and
a dislocation reducing layer comprising a nitride based compound semiconductor, formed in a location between a location directly under said buffer layer and an inner area of said semiconductor operating layer, and comprising a lower layer area and an upper layer area each having an uneven boundary surface, wherein the lower layer area and the upper layer area are made of semiconductor materials that have the same composition and a threading dislocation extending from the lower layer area to the upper layer area is bent at said boundary surface.

2. The semiconductor electronic device according to claim 1, wherein said dislocation reducing layer is formed at a location where at least one of said first semiconductor layer and/or said second semiconductor layer reside between the dislocation reducing layer and said substrate.

3. The semiconductor electronic device according to claim 1, wherein said dislocation reducing layer is formed directly under said semiconductor operating layer.

4. The semiconductor electronic device according to claim 1, wherein said dislocation reducing layer is formed inside said semiconductor operating layer.

5. The semiconductor electronic device according to claim 1, wherein said nitride based compound semiconductor of said dislocation reducing layer has a smaller lattice constant and a greater coefficient of thermal expansion than said substrate.

6. The semiconductor electronic device according to claim 1, wherein said dislocation reducing layer has a thickness between 100 nm and 3000 nm.

7. The semiconductor electronic device according to claim 1, wherein said dislocation reducing layer has island-shaped nuclei at a bottom of said lower layer area, comprised of silicon nitride or silicon oxide.

8. The semiconductor electronic device according to claim 1, wherein said substrate is comprised of silicon.

9. The semiconductor electronic device according to claim 1, wherein said dislocation reducing layer has at least one warp reducing layer comprised of a nitride based compound semiconductor having a smaller lattice constant than said lower layer area and a greater coefficient of thermal expansion than said substrate.

10. The semiconductor electronic device according to claim 1, further comprising,
an interstitial layer formed directly on said substrate, comprising a nitride based compound semiconductor having a smaller lattice constant than said first semiconductor layer and a greater coefficient of thermal expansion than said substrate.

11. The semiconductor electronic device according to claim 1, wherein said buffer layer is formed so that thickness for said first semiconductor layer becomes thicker in a direction of lamination.

12. The semiconductor electronic device according to claim 1, wherein said dislocation reducing layer has a thickness between 200 nm and 3000 nm.

13. The semiconductor electronic device according to claim 1, wherein said second semiconductor layer has a thickness between 0.5 nm and 200 nm.

14. The semiconductor electronic device according to claim 1, wherein said lower layer area and said upper layer area are made of GaN.

15. A method for manufacturing a semiconductor electronic device comprising:
a buffer layer forming step for forming a buffer layer on a substrate, having two or more layers of composite layers in which a first semiconductor layer comprising a nitride based compound semiconductor having a smaller lattice constant and a greater coefficient of thermal expansion than the substrate and a second semiconductor layer comprising a nitride based compound semiconductor having a smaller lattice constant and a smaller coefficient of thermal expansion than the first semiconductor layer are alternately laminated; and
a semiconductor operating layer forming step for forming a semiconductor operating layer comprised of a nitride based compound semiconductor on said buffer layer; and
wherein said buffer layer forming step or said semiconductor operating layer forming step includes a dislocation reducing layer forming step for forming a dislocation reducing layer comprised of a nitride based compound semiconductor between a location directly under said buffer layer and an inner area of said semiconductor operating layer, formed of a lower layer area and an upper layer area each having an uneven boundary surface, wherein the lower layer area and the upper layer area are formed of semiconductor materials that have the same composition, and wherein a threading dislocation extending from the lower layer area to the upper layer area is formed to be bent at said boundary surface.

16. The method for manufacturing a semiconductor electronic device according to claim 15, wherein in said dislocation reducing layer forming step, island-shaped nuclei comprising a nitride based compound semiconductor having a smaller lattice constant and a greater coefficient of thermal expansion than said substrate are formed, and the lower layer area comprising a nitride based compound semiconductor having a smaller lattice constant and a greater coefficient of thermal expansion than said substrate is formed so as to cover the island-shaped nuclei.

17. The method for manufacturing a semiconductor electronic device according to claim 16, wherein said island-shaped nuclei are formed at a substrate temperature between 400° C. and 600° C.

18. The method for manufacturing a semiconductor electronic device according to claim 15, wherein in said dislocation reducing layer forming step, island-shaped nuclei comprising silicon nitride or silicon oxide are formed, and the lower layer area comprising a nitride based compound semiconductor having a smaller lattice constant and a greater coefficient of thermal expansion than said substrate is formed so as to cover the island-shaped nuclei.

19. The method for manufacturing a semiconductor electronic device according to claim 15, further comprising,
an interstitial layer forming step for forming an interstitial layer directly on said substrate, comprising a nitride based compound semiconductor having a smaller lattice constant than said first semiconductor layer and a greater coefficient of thermal expansion than said substrate.

* * * * *